United States Patent
Kannari et al.

(10) Patent No.: US 8,766,084 B2
(45) Date of Patent: Jul. 1, 2014

(54) THERMOELECTRIC GENERATION APPARATUS

(71) Applicant: Sasakura Engineering Co., Ltd., Osaka (JP)

(72) Inventors: Toru Kannari, Osaka (JP); Yoshiaki Miho, Osaka (JP)

(*) Notice: Subject to any disclaimer, the term of this patent is extended or adjusted under 35 U.S.C. 154(b) by 0 days.

(21) Appl. No.: 13/760,841

(22) Filed: Feb. 6, 2013

(65) Prior Publication Data

US 2013/0213450 A1    Aug. 22, 2013

(30) Foreign Application Priority Data

Feb. 16, 2012 (JP) ................................. 2012-031346

(51) Int. Cl.
*H01L 35/30*    (2006.01)

(52) U.S. Cl.
USPC .......................................... 136/205; 133/206

(58) Field of Classification Search
USPC ................................................. 136/205, 206
See application file for complete search history.

(56) References Cited

U.S. PATENT DOCUMENTS

2011/0258995 A1*    10/2011    Limbeck et al. ............... 60/320

FOREIGN PATENT DOCUMENTS

JP           2009247050 A    *  10/2009
WO    WO 2011/121852 A       10/2011

OTHER PUBLICATIONS

JP2009247050A, Nakatani et al. pub: 20091022, English Equivalent of abstract.*

* cited by examiner

*Primary Examiner* — Susan D Leong
(74) *Attorney, Agent, or Firm* — Sterne, Kessler, Goldstein & Fox P.L.L.C.

(57) ABSTRACT

A thermoelectric generation apparatus 1 including a high-temperature pipe 10 through which a high-temperature fluid passes; a low-temperature pipe 20 disposed horizontally adjacent to the high-temperature pipe 10 and through which a low-temperature fluid having a temperature lower than that of the high-temperature fluid passes; a thermoelectric module 32 interposed between the high-temperature pipe 10 and the low-temperature pipe 20 and generating power using a temperature difference between the high-temperature pipe 10 and the low-temperature pipe 20; a fluid chamber 28 connected to an upper portion and a lower portion of the low-temperature pipe 20, parallel to the low-temperature pipe 20; and a fluid replenisher 110 capable of replenishing the fluid chamber 28 with the low-temperature fluid in a liquid state.

8 Claims, 5 Drawing Sheets

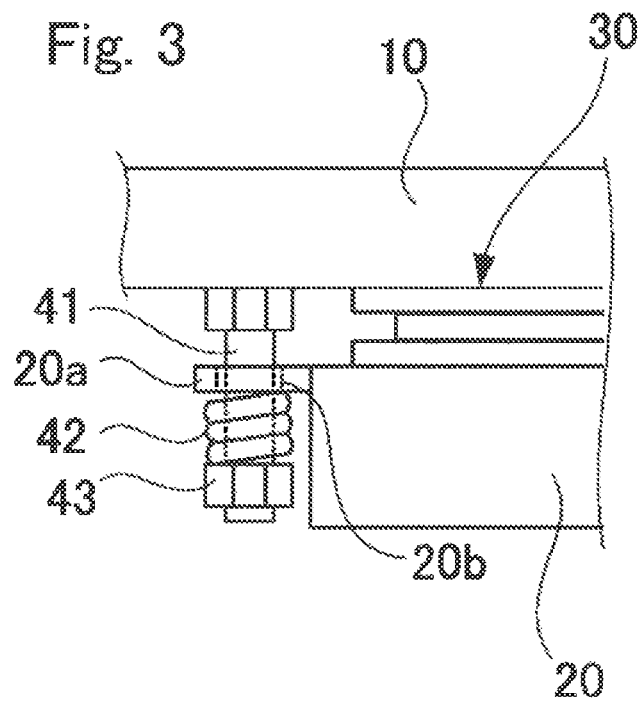
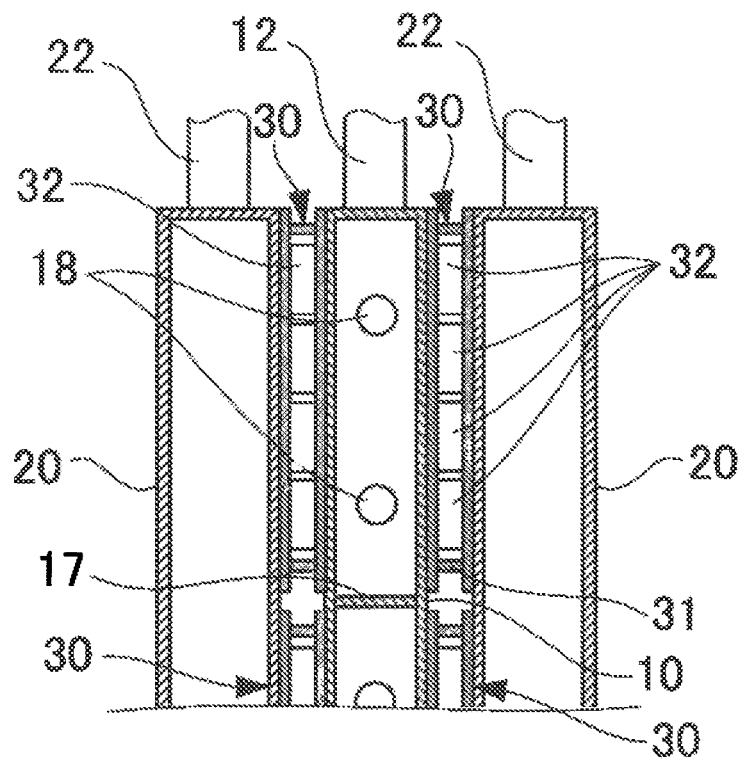

THERMOELECTRIC GENERATION APPARATUS

BACKGROUND OF THE INVENTION

1. Field of the Invention

The present invention relates to a thermoelectric generation apparatus.

2. Description of Related Art

A known example of conventional thermoelectric generation apparatuses is disclosed as a steam generation apparatus in WO 2011/121852A. The steam generation apparatus is provided, inside its housing, with pipe members through which a high-temperature heating medium passes, and a thermoelectric element module is attached on the surface of the pipe member. The thermoelectric element module is covered with a heat transfer plate, and water is ejected onto the surface of the heat transfer plate from a spray nozzle.

With the steam generation apparatus including the above-described configuration, water supplied to the heat transfer plate is heated by the high-temperature heating medium to produce water vapor, and at the same time, electric power can be generated using the temperature difference occurring in the thermoelectric element.

When the supply of the heating medium to the pipe member and the ejection of water onto the heat transfer plate both stop due to a power failure or the like in the above-described conventional steam generation apparatus, the heating of the pipe member is maintained by the high-temperature heating medium remaining inside the pipe member, whereas the cooling of the heat transfer plate is stopped after the ejected water has evaporated. Therefore, especially the heat transfer plate side tends to be heated to a higher temperature than usual, which may result in degradation of the electric wiring of the thermoelectric element module, the insulating structure, and so forth.

For the above-described conventional steam generation apparatus, it has been also proposed to cascade thermoelectric, element modules for high temperature, and thermoelectric element modules for low temperature by stacking these thermoelectric element modules in order to increase the power generation efficiency.

However, there is the possibility that, when the thermoelectric element modules for low temperature are heated to a high temperature as a result of a power failure or the like as described above, the thermoelectric elements made of a material for low temperature (for example, Bi-Te) themselves or joint portions made of solder or the like may undergo degradation and damage due to oxidation or the like.

SUMMARY OF THE INVENTION

Therefore, it is an object of the present invention to provide a thermoelectric generation apparatus capable of reliably preventing damage during operational. shutdown and maintaining a good power generation performance.

The above-described object of the present invention can be achieved by a thermoelectric generation apparatus including; a high-temperature pipe through which a high-temperature fluid passes; a low-temperature pipe disposed horizontally adjacent to the high-temperature pipe and through which a low-temperature fluid having a temperature lower than that of the high-temperature fluid passes; a thermoelectric module interposed between the high-temperature pipe and the low-temperature pipe and generating power using a temperature difference between the high-temperature pipe and the low-temperature pipe; a fluid chamber connected to an upper portion and a lower portion of the low-temperature pipe, parallel to the low-temperature pipe; and a fluid replenisher capable of replenishing the fluid chamber with the low-temperature fluid in a liquid state.

In the thermoelectric generation apparatus, the fluid chamber preferably includes a level sensor capable of detecting a. liquid level of the low-temperature fluid inside the low-temperature pipe.

Preferably, the thermoelectric generation apparatus further includes a vessel containing the high-temperature pipe, the low-temperature pipe and the thermoelectric module and the internal pressure of which can be reduced. Preferably, the fluid chamber is provided outside the vessel.

The fluid replenisher may be configured by a tank for storing the low-temperature fluid for reserve. Preferably, this configuration further includes fail-safe valves respectively provided on a supply side and a discharge side of the low-temperature pipe and configured to block the supply side of the low-temperature pipe while opening the discharge side of the low-temperature pipe, when the supply of the low-temperature fluid to the low-temperature pipe is stopped.

Alternatively, the fluid replenisher may be configured by a condenser interposed between the discharge side of the low-temperature pipe and a supply side of the fluid chamber and configured to condense the steam generated from the low-temperature fluid discharged from the low-temperature pipe. Preferably, this configuration further includes fail-safe valves respectively provided on the supply side and the discharge side of the low-temperature pipe and configured to block both the supply side and the discharge side of the low-temperature pipe to form a closed loop between the low-temperature pipe and the fluid chamber, when the supply of the low-temperature fluid to the low-temperature pipe is stopped.

Preferably, each of the above-described thermoelectric generation apparatuses further includes fail-safe valves respectively provided on a supply side and a discharge side of the high-temperature pipe and configured to block both the supply side and the discharge side of the high-temperature pipe, when the supply of the high-temperature fluid to the high-temperature pipe is stopped.

According to the present invention, it is possible to provide a thermoelectric generation apparatus capable of reliably preventing damage during an operation stoppage and thus maintaining a good power generation performance.

BRIEF DESCRIPTION OF THE DRAWINGS

FIG. 3 is an enlarged view showing a relevant part of the thermoelectric generation apparatus shown in FIG. 1.

FIG. 4 is an enlarged cross-sectional view of another relevant part of the thermoelectric generation apparatus shown in FIG. 1.

DETAILED DESCRIPTION OF THE INVENTION

Figure 1:
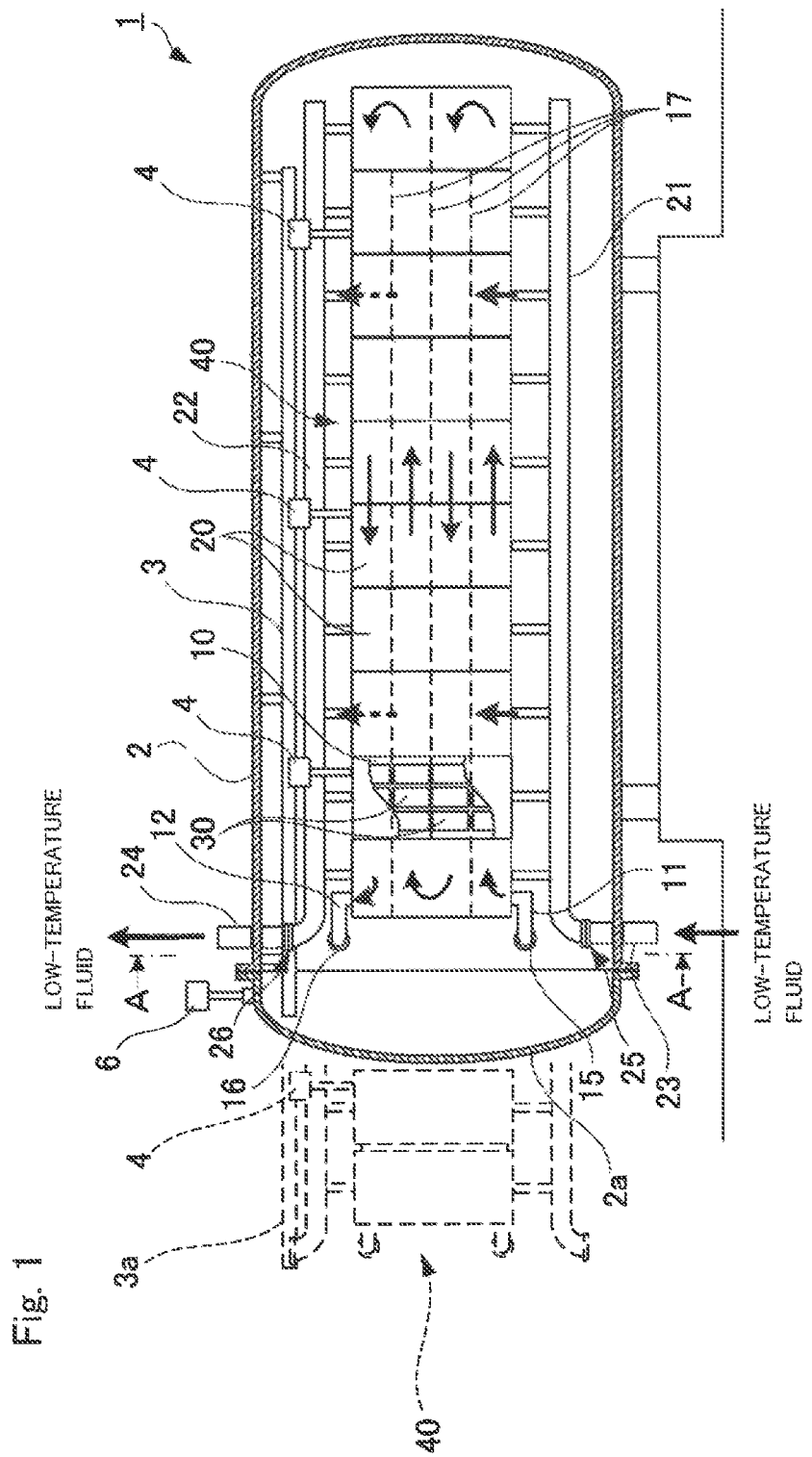
FIG. 1 is a schematic configuration diagram of a thermoelectric generation apparatus according to one embodiment of the present invention.
Figure 2:
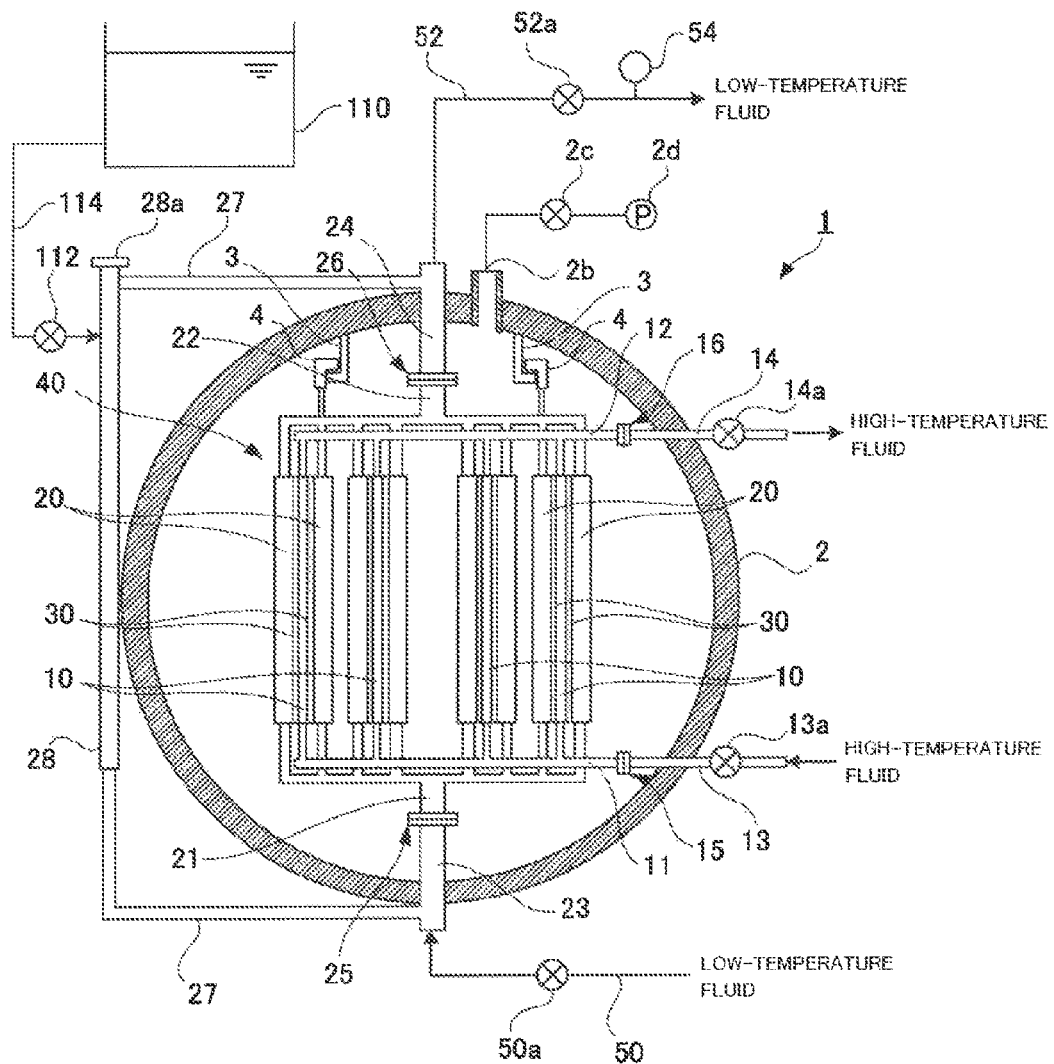
FIG. 2 is a cross-sectional view taken along the arrows A-A in FIG. 1.

Hereinafter, an embodiment of the present invention will now be described with reference to the accompanying drawings. FIG. 1 is a schematic configuration diagram of a thermoelectric generation apparatus according to one embodiment of the present invention. FIG. 2 is a cross-sectional view taken along the arrows A-A in FIG. 1. As shown in FIGS. 1 and 2, a thermoelectric generation apparatus 1 is configured by containing, inside a vessel 2, a main body 40 including high-temperature pipes 10, low-temperature pipes 20 and thermoelectric units 30. The vessel 2, which has a cylindrical shape, includes, at one longitudinal end thereof a lid head plate 2a capable of being opened and closed, and is installed horizontally on a floor or the like. A vent outlet 2b of the vessel 2 is connected via a valve 2c to a suction device 2d such as a vacuum pump or a steam ejector, and the pressure inside the vessel 2 can be reduced to a vacuum state by discharging air by the suction device 2d. The inner surface of the vessel 2 is laminated with aluminum or mirror finished so as to be able to suppress heat radiation to the outside of the vessel 2.

A plurality of high-temperature pipes 10, each having a flat rectangular section, are disposed extending along the longitudinal direction of the vessel 2. The branched portions of branch pipes 11 and 12, each having a plurality of branched portions, are connected to the lower portion and the upper portion, respectively, of the high-temperature pipes 10 at one longitudinal end thereof. The branch pipes 11 and 12 are connected, via flange portions 15 and 16, respectively, to a high-temperature fluid feed pipe 13 and a high-temperature fluid outlet pipe 14, respectively, which are fixed to the side wall of the vessel 2, thus providing a configuration that allows a high-temperature fluid to be supplied from the lower portion and be discharged from the upper portion of the high-temperature pipes 10. As indicated by a dashed line in FIG. 1, the interior of each of the high-temperature pipes 10 is divided into vertically arranged sections by partition walls 17, forming a high-temperature fluid flow channel such that the high-temperature fluid flowing along the high-temperature pipes 10 rises at the ends, turns back, and moves back and forth in this manner. Preferably, the high-temperature fluid is a liquid heated to 200° C. or higher (preferably 300° C. or higher) and having a large heat capacity. Specific examples thereof include molten salt, oil, and molten metal. Although there is no particular limitation with respect to the production of the high-temperature fluid, it is preferable to use an apparatus that produces the high-temperature fluid heated by solar energy.

Control valves 13a and 14a are provided in the high-temperature fluid feed pipe 13 and the high-temperature fluid outlet pipe 14, respectively. The control valves 13a and 14a are fail-safe valves, each of which is configured to block the flow channel when the supply of the high-temperature fluid to the high-temperature pipe 10 is stopped upon occurrence of an abnormality such as a electrical power failure. Any known actuators, including, for example, pneumatic actuators and electrically operated actuators, may be used for the control valves 13a and 14a having this fail-close mechanism. The blocking of the flow channels using the control valves 13a and 14a upon occurrence of an abnormality can also be performed manually.

The low-temperature pipes 20 are disposed on both sides of each of the high-temperature pipes 10 in the horizontal direction thereof (that is, both sides of the rectangular section in the shorter direction), and a plurality of the low-temperature pipes 20 are provided in a partitioned manner along the horizontal direction in which the high-temperature pipes 10 extend. In order to reduce the radiation heat loss from the high-temperature pipes 10 to a minimum, the low-temperature pipes 20 are preferably disposed so as to cover the entire side wall of the high-temperature pipes 10 without any gap. The branched portions of branch pipes 21 and 22, each having a plurality of branched portions, are connected to the lower portion and the upper portion, respectively, of the low-temperature pipes 20. The branch pipes 21 and 22 are connected, via flange portions 25 and 26, respectively, to a low-temperature fluid feed pipe 23 and a low-temperature fluid outlet pipe 24, respectively, which are fixed to the side wall of the vessel 2, thus providing a configuration that allows a low-temperature fluid to be supplied from the lower portion and be discharged from the upper portion of the low-temperature pipes 20. The low-temperature fluid supplied to the low-temperature pipes 20 preferably may be, for example, a liquid having a large heat capacity, such as water, then heated due to heat exchange between fluids in the low-temperature pipes 20 and the high-temperature pipes 10, and discharged from the low-temperature pipes 20. Although a plurality of low-temperature pipes 20 are connected to the low-temperature fluid feed pipe 23 and the low-temperature fluid outlet pipe 24 via the blanch pipes 21 and 22 in this embodiment, the lower portion and the upper portion of a single low-temperature pipe 20 may be directly connected to the low-temperature fluid feed pipe 23 and the low-temperature fluid outlet pipe 24, respectively.

As shown in FIG. 2, a fluid chamber 28 is connected to the low-temperature fluid feed pipe 23 and the low-temperature fluid outlet pipe 24 via a communicating pipe 27, parallel to the low-temperature pipes 20. The fluid chamber 28 is disposed outside the vessel 2 so as to include at least a region having the same height as the low-temperature pipe 20 in the vertical direction. Also, the fluid chamber 28 includes a level sensor 28a for detecting the liquid level inside the low-temperature pipe 20. Various sensors, including, for example, float-type sensors, pneumatic sensors, electrode sensors and ultrasonic sensors, can be used as the level sensor 28a. A single sensor may be provided, or a plurality of sensors may be provided at different heights of the fluid chamber 28. The low-temperature fluid feed pipe 23 and the low-temperature fluid outlet pipe 24 are connected to an inlet pipe 50 and an outlet pipe 52, respectively. Control valves 50a and 52a are provided in the inlet pipe 50 and the outlet pipe 52, respectively. Further, the outlet pipe 52 is provided with a temperature sensor (or pressure sensor) 54 for detecting the temperature (or pressure) of the steam passing through the outlet pipe 52. A control unit (not shown) adjusts the opening of the control valves 50a of the inlet pipe 50 such that the liquid level inside the low-temperature pipe 20 detected by the level sensor 28a of the fluid chamber 28 is maintained in a predetermined height range, and also adjusts the opening of the control valve 52a of the outlet pipe 52 based on the detection performed by the temperature sensor (or pressure sensor) 54 such that the temperature or pressure of the steam passing through the outlet pipe 52 is maintained at a desired value. Thereby, the temperature or pressure of the generated steam can be set and adjusted in accordance with the intended use of the generated steam on the downstream side. Although the fluid chamber 28 is connected to both the upper portion and the lower portion of the low-temperature pipe 20 via the low-temperature fluid feed pipe 23, the low-temperature fluid outlet pipe 24 and the communicating pipe 27 in this embodiment, it may be directly connected to the upper portion and the lower portions of the low-temperature pipe 20.

The control valves 50a and 52a are fail-safe valves, which are, in this embodiment, configured such that the control valve 50a located on the supply side of the low-temperature pipe 20 blocks the flow channel (fail-closes) and the control valve 52a located on the discharge side of the low-temperature pipe 20 opens the flow channel (fail-opens), when the supply of the low-temperature fluid to the low-temperature pipe 20 is stopped upon occurrence of an abnormality such as a electrical power failure. Any known actuators, including, for example, pneumatic actuators and electrically operated actuators, may be used for the control valves 50a and 52a as well. The above-described operation of the control valves 50a and 52a upon occurrence of an abnormality can also be performed manually.

The fluid chamber 28 is connected to a tank 110 serving as a fluid replenisher via an inlet pipe 114 including an control valve 112. In the tank 110, a low-temperature fluid (for example, water) of the same kind as the low-temperature fluid passing through the low-temperature pipe 20 is stored in advance in a liquid state. The tank 110 is disposed above the fluid chamber 28 so as to be able to replenish the fluid chamber 28 with the low-temperature fluid using its own weight upon occurrence of an abnormality such as a power failure. The control valve 112 is, preferably but not necessarily limited to, a fail-open valve that is opened upon occurrence of an abnormality such as a electrical power failure. Alternatively, the control valve 112 may be opened manually.

It is possible to adopt a configuration in which the low-temperature fluid stored in the tank 110 is supplied to the fluid chamber 28 via the communicating pipe 27, rather than being directly supplied to the fluid chamber 28 as in this embodiment. In either case, by supplying the low-temperature fluid to the fluid chamber 28 disposed outside the vessel 2, the low-temperature fluid can be supplied to the low-temperature pipe 20 disposed parallel to the fluid chamber 28. Accordingly, the supply of the low-temperature fluid in a liquid state to the low-temperature pipe 20 disposed inside the vessel 2 can be facilitated.

The thermoelectric units 30 are disposed on both sides of each of the high-temperature pipes 10 in the horizontal direction (i.e., both sides of the rectangular cross section in the shorter direction), and are interposed between the high-temperature pipe 10 and the low-temperature pipe 20. As shown in FIG. 3, the low-temperature pipe 20 and the thermoelectric unit 30 can be attached to the high-temperature pipe 10, for example, by inserting a bolt 41 fixed to the surface of the high-temperature pipe 10 through a bolt hole 20b formed in a flange portion 20a of the low-temperature pipe 20, followed by further inserting the bolt 41 through a coil spring 42, and screwing a nut 43 such that the coil spring 42 is sufficiently compressed. Attaching a plurality of portions of the low-temperature pipe 20 to the high-temperature pipe 10 using this assembling method makes it possible to have a reliable contact pressure of the thermoelectric unit 30 between the high-temperature pipe 10 and the low-temperature pipe 20 by the biasing force of the coil spring 42, and keep pressing the low-temperature pipe 20 even if the bolt 41 is thermally expanded due to heat dissipation from the high-temperature pipe 10 as long as the coil spring 42 is maintained in a compressed state. That is, it is possible to reliably prevent a reduction in the contact pressure of the thermoelectric unit 30 by deformation due to a large temperature difference ranging from low temperatures to high temperatures, thereby achieving stable electrical power generation performance.

As shown in the cross-sectional view in FIG. 4, each of the thermoelectric units 30 includes a plurality of thermoelectric modules 32 disposed inside a seal member 31 made of an electrically insulating material or the like in a matrix configuration. Each of the thermoelectric modules 32 has a known configuration in which a plurality of p-type semiconductor elements and n-type semiconductor elements (both not shown) that are alternately connected with electrodes interposed therebetween, and is disposed so as to generate electrical power using a temperature difference between the high-temperature pipe 10 and the low-temperature pipe 20. The size of the thermoelectric modules 32 is, for example, 50 mm×50 mm. In this embodiment, eight thermoelectric modules 32 constitute a thermoelectric unit 30 having substantially the same size as that of a low-temperature pipe 20. The durability of the elements can be increased by preventing their degradation by sealing the interior space of the seal member 31 into a vacuum, or enclosing a gas therein. However, it is also possible to adopt a configuration in which the seal member 31 is omitted, in order to promote heat conduction from the high-temperature pipes 10 to the low-temperature pipes 20, thereby reducing radiation heat loss. By disposing the small-sized thermoelectric modules 32 between the high-temperature pipe 10 and the low-temperature pipe 20 as in this embodiment, the thermoelectric modules 32 can be individually pressed to the high-temperature pipes 10 and the low-temperature pipes 20. Accordingly, it is possible to reduce radiation heat loss and thus achieve high power generation efficiency.

As shown in the partial cutaway view of a low-temperature pipe 20 in FIG. 1, a plurality of the thermoelectric units 30 are arranged in a matrix configuration by being assembled in a partitioned manner along the high-temperature pipe 10 and also along the vertical direction, which is orthogonal to the high-temperature pipe 10. Electric power can be supplied to the outside of the vessel 2 by connecting adjacent thermoelectric units 30 either in series or parallel using lead wire (not shown). By arranging a plurality of thermoelectric units 30 each constituted by a plurality of thermoelectric modules 32 as in this embodiment, operations such as maintenance, repair and replacement can be performed promptly and easily for the thermoelectric units 30 on a unit-by-unit basis. However, the unitization of the thermoelectric modules 32 is not essential for the present invention, and the thermoelectric modules 32 may be separately disposed on the surface of the high-temperature pipes 10. In this case as well, it is preferable to dispose the thermoelectric modules 32 sequentially along the horizontal direction in which the high-temperature pipes 10 extend.

There is no particular limitation with respect to the materials for the p-type semiconductor elements and the n-type semiconductor elements of the thermoelectric modules 32, and the materials may be appropriately selected from known materials according to the temperature of the high-temperature pipes 10 in which the thermoelectric modules 32 are disposed. For example, Bi-Te materials can be used for a low-temperature range, and silicide materials can be used for a high-temperature range. In the case where the temperature of the high-temperature pipes 10 is high (for example, 300° C. or higher), the thermoelectric modules 32 may be cascaded with two types of high temperature and low temperature semiconductor materials so as to allow for thermoelectric generation in a wide temperature range from a high-temperature range to a low-temperature range, which makes it possible to increase the thermoelectric generation efficiency. Furthermore, since the high-temperature pipes 10 have a temperature gradient along the flow direction of the high-temperature fluid, the selection of the semiconductor materials for the thermoelectric modules 32 can be made individually, according to the area of the high-temperature pipes 10 where the thermoelectric modules 32 are disposed. This configuration makes it possible to increase the power generation efficiency of the individual thermoelectric modules 32, and therefore a thermoelectric unit 30 and an assembly thereof that can utilize the temperature difference highly efficiently can be obtained.

As shown in FIG. 4, heating elements 18 each composed of an electric heater, a high-temperature steam pipe, or the like are disposed inside the flow channel formed inside the high-temperature pipes 10 such that they extend along the high-temperature pipes 10. The high-temperature pipes 10 are further provided with a drain (not shown) and the high-temperature fluid can be discharged to the outside in an unused state, for example, at the time of stoppage.

As shown in FIGS. 1 and 2, the main body 40, which includes the high-temperature pipes 10, the low-temperature pipes 20 and the thermoelectric units 30 described above, is suspended from and supported by two guide rails 3 fixed to the inner upper face of the vessel 2, via a plurality of support members 4. The support members 4 are configured such that their lower end is fixed to the upper portion of the main body 40 (for example, the high-temperature pipe 10) and their upper end is movable along the guide rails 3. Also, the lid head plate 2a of the vessel 2 is supported by a suspender (not shown) so as to be removable, for example, by being rotated. The guide rails 3 are configured to be extendable by means of, for example, a telescopic structure, so that conveyor rails 3a can be extended to the outside of the vessel 2 as indicated by a dashed line in FIG. 1 in a state in which the lid head plate 2a is removed. Rather than being extended from the guide rails 3, the conveyor rails 3a may be connected to the guide rails 3 from the outside of the vessel 2 and supported by a strut (not shown) or the like.

With the thermoelectric generation apparatus 1 having the above-described configuration, the lid head plate 2a of the vessel 2 is closed and the pressure inside the vessel 2 is reduced to a vacuum. Thereafter, a high-temperature fluid and a low-temperature fluid are supplied to the high-temperature pipes 10 and the low-temperature pipes 20, respectively. Consequently, heat is exchanged between the high-temperature fluid and the low-temperature fluid, and the resulting water vapor is discharged from the low-temperature fluid outlet pipe 24. Concurrently with this, a temperature difference occurs in the thermoelectric units 30, and therefore electric power can be drawn to the outside.

With the thermoelectric generation apparatus 1 according to this embodiment, it is possible to supply the low-temperature fluid in a liquid state to the fluid chamber 28 from the tank 110 by opening the control valve 112 upon occurrence of an abnormality such as a power failure. Accordingly, even if the low-temperature fluid inside the low-temperature pipe 20 evaporates by the heat of the high-temperature fluid remaining in the high-temperature pipe 10 in a state in which the supply of the low-temperature fluid from the inlet pipe 50 to the low-temperature pipe 20 is stopped, it is possible to replenish the fluid chamber 28 with an amount of the low-temperature fluid in a liquid state corresponding to the amount of the distillation, and therefore, the low-temperature fluid in a liquid state can be maintained inside the low-temperature pipe 20 disposed parallel to the fluid chamber 28. Consequently, there is no possibility that the low-temperature pipe 20 is heated to an abnormally high temperature by the heat of the high-temperature pipe 10, which makes it possible to prevent the low-temperature pipe 20 itself and the packing, couplings and the like used for the low-temperature pipe 20 from being degraded or damaged by heat. Furthermore, due to the same reason, it is also possible to prevent the thermoelectric module 32 from being heated to an abnormally high temperature. Accordingly, there is no possibility that the thermoelectric module for low temperature undergoes degradation and damage even if the thermoelectric module 32 has a cascaded configuration, and therefore it is possible to maintain a good power generation performance.

Furthermore, with the thermoelectric generation apparatus 1, the supply side of the low-temperature pipe 20 is blocked and the discharge side of the low-temperature pipe 20 is opened by the control valves 50a and 52a, which are fail-safe valves, when the supply of the low-temperature fluid from the inlet pipe 50 to the low-temperature pipe 20 is stopped as a result of a power failure or the like. Accordingly, it is possible to release the steam generated in the low-temperature pipe 20 to the outside to promote the heat dissipation of the low-temperature pipe 20, thereby preventing thermal damage of the low-temperature pipe 20 and the thermoelectric module 32 in a more reliable manner.

Furthermore, with the thermoelectric generation apparatus 1, both the supply side and the discharge side of the high-temperature pipe 10 are blocked by the control valves 13a and 14a, which are fail-safe valves, when the supply of the high-temperature fluid to the high-temperature pipe 10 is stopped as a result of a power failure or the like. Accordingly, it is possible to suppress the entrance of heat to the high-temperature pipe 10 from the outside, thus making it easy to maintain the low-temperature pipe 20 in a low-temperature state. It is also possible to open the drain (not shown) of the high-temperature pipe 10, thus discharging the high-temperature fluid remaining in the high-temperature pipe 10 to the outside.

Figure 5:
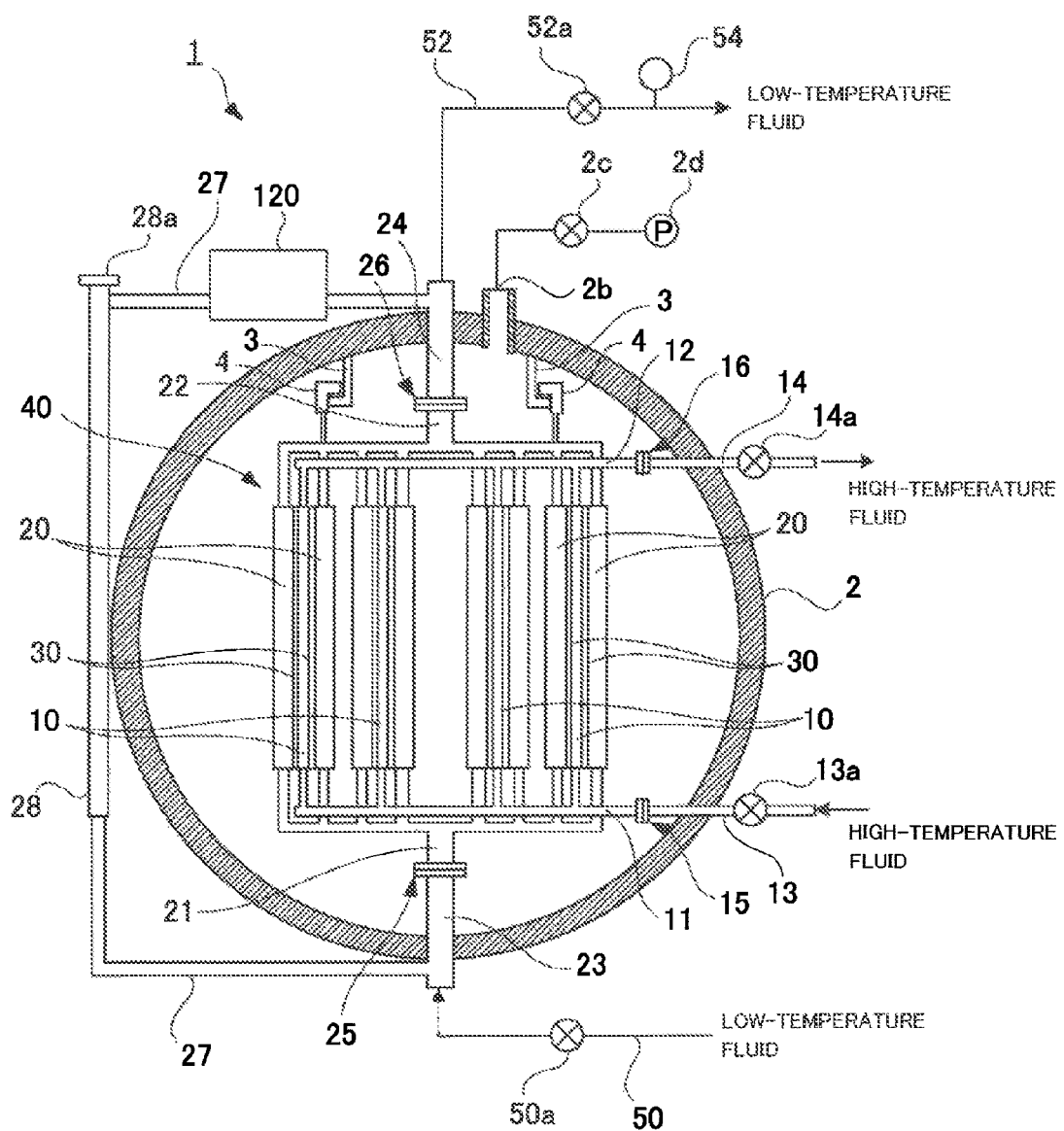
FIG. 5 is a schematic configuration diagram of a thermoelectric generation apparatus according to another embodiment of the present invention, corresponding to FIG. 2.

Although an embodiment of the present invention has been described thus far, specific modes of the present invention are not limited to the above-described embodiment. For example, although the tank 110 is used as a fluid replenisher for replenishing the fluid chamber 28 with the low-temperature fluid in a liquid state in this embodiment, it is also possible to adopt a different configuration as long as the fluid chamber 28 can be replenished with an amount of the low-temperature fluid in a liquid state corresponding to the amount of steam generated inside the low-temperature pipe 20 upon occurrence of an abnormality such as a power failure. For example, as shown in FIG. 5, a condenser 120 may be provided in the communicating pipe 27 connecting the discharge side of the low-temperature pipe 20 and the supply side of the fluid chamber 28, and thereby the condenser 120 may serve the function of the fluid replenisher. That is, the steam generated in the low-temperature pipe 20 is cooled and condensed by passing through the condenser 120, and thereafter the condensed water is supplied to the fluid chamber 28. Accordingly, it is possible to replenish the low-temperature pipe 20 with the low-temperature fluid in a liquid state. There is no particular limitation with respect to the configuration of the condenser 120, and the condenser 120 may be of an air cooling-type or a water cooling-type, or may be a combination thereof. However, the condenser 120 is preferably operable during a power failure. Specifically, when the condenser 120 is of an air cooling-type, an air cooling fan can be operated by a generator and a storage battery using solar light, wind power, an engine or the like. On the other hand, when the condenser 120 is of a water cooling-type, cooling water can be supplied to the condenser 120 from a water source such as a water service pipe via a fail-open valve.

With the thermoelectric generation apparatus 1 shown in FIG. 5, both of the control valves 50a and 52a, which are fail-safe valves, for the low-temperature fluid are preferably fail-close valves that block the flow channels upon occurrence of an abnormality such as a power failure. In this case, a closed loop is formed by the communicating pipe 27 between the low-temperature pipe 20 and the fluid chamber 28, and the entire steam generated in the low-temperature pipe 20 can be introduced into the condenser 120, which makes it possible to maintain the liquid level inside the low-temperature pipe 20 in a more reliable manner. As with the configuration shown in FIG. 2, both of the control valves 13a and 14a for the high-temperature fluid are also preferably fail-close valves.

By providing each of the thermoelectric generation apparatuses 1 according to the above-described embodiments with a heat source supply apparatus for generating a high-temperature fluid heated by solar energy, it is possible to easily provide a large amount of high-temperature fluid that has been heated to a required temperature. The specific configuration of the heat source supply apparatus is known, and is disclosed, for example, in WO 2011/121852A.

Figure 6:
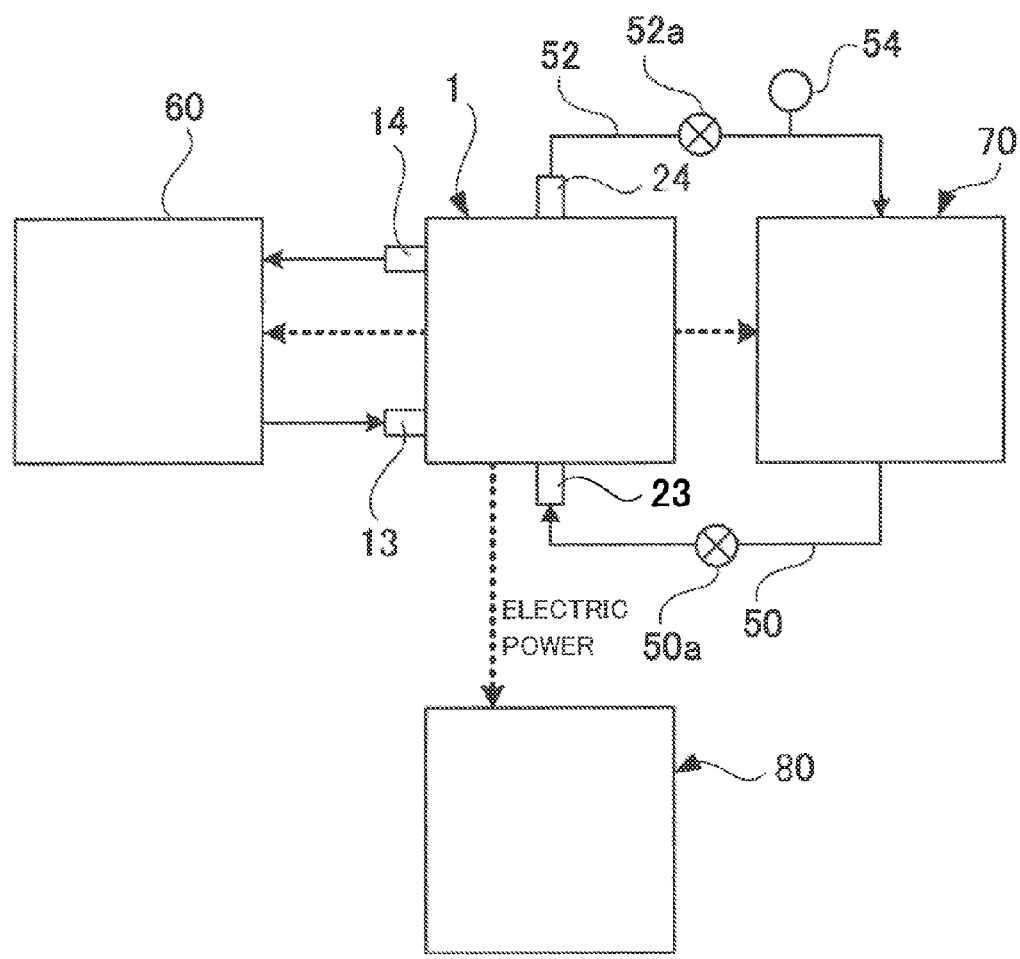
FIG. 6 is a schematic configuration diagram showing an example of seawater desalination system using the thermoelectric generation apparatus shown in FIG. 1.

In addition to being used as a power generation apparatus for generating power using a temperature difference between the high-temperature pipe 10 and the low-temperature pipe 20, each of the thermoelectric generation apparatuses 1 of the above-described embodiments can also be used as a steam generation apparatus by heating and evaporating the low-temperature fluid introduced to the low-temperature pipe 20 using a heat exchange with the high-temperature pipe 10. When the thermoelectric generation apparatus 1 of the present invention is also used as a steam generation apparatus, the thermoelectric generation apparatus 1 may be combined with an thermal seawater desalination apparatus 70 to form a seawater desalination system, as shown in FIG. 6. Examples of the methods used for the thermal seawater desalination apparatus 70 include multi-stage flash distillation and multi-effect distillation. The thermal seawater desalination apparatus 70 desalinates seawater by distillation using, as its heat source, the steam from the low-temperature fluid introduced from the low-temperature fluid outlet pipe 24 (see FIG. 2) of the thermoelectric generation apparatus 1. The steam from the low-temperature fluid that has undergone heat exchange with seawater is condensed, and thereafter supplied to the low-temperature pipes 20 again from the low-temperature fluid feed pipe 23 (see FIG. 2) of the thermoelectric generation apparatus 1. The steam temperature of the low-temperature fluid introduced to the thermal seawater desalination apparatus 70 is preferably set in a temperature range of 50 to 185° C. In particular, setting the steam temperature of the low-temperature fluid to 140 to 185° C. (e.g., 175° C.) makes it possible to reuse part of the steam from the low-temperature fluid that has been used for the seawater desalination process for the desalination process by means of a steam ejector, thus increasing the processing capability. As described above, the steam temperature of the low-temperature fluid introduced to the thermal seawater desalination apparatus 70 can be maintained at a desired temperature by adjusting the openings of the control valves 50a and 52a (see FIG. 2) of the inlet pipe 50 and the outlet pipe 52.

The seawater desalination system shown in FIG. 6 includes a heat source supply apparatus 60 for producing the high-temperature fluid heated by solar energy, such as the one described above. The high-temperature fluid heated in the heat source supply apparatus 60 is supplied to the high-temperature fluid feed pipe 13 (see FIG. 2) of the thermoelectric generation apparatus 1, then used for power generation and steam generation, and thereafter supplied from the high-temperature fluid outlet pipe 14 (see FIG. 2) to the heat source supply apparatus 60 for reheating.

The seawater desalination system shown in FIG. 6 further includes a reverse osmosis membrane-based seawater desalination apparatus 80. The reverse osmosis membrane-based seawater desalination apparatus 80 includes various pumps (not shown) for intake of seawater, permeation of seawater through the reverse osmosis membrane, delivery of the produced fresh water, and so forth. By driving these pumps and the like using electric power generated by the thermoelectric generation apparatus 1, it is possible to realize effective utilization of energy while avoiding constraints imposed by the location conditions. In the seawater desalination system shown in FIG. 6, the electric power generated by the thermoelectric generation apparatus 1 can also be used for operating the heat source supply apparatus 60 and the thermal seawater desalination apparatus 70.

The invention claimed is:

1. A thermoelectric generation apparatus comprising:
   a high-temperature pipe through which a high-temperature fluid passes;
   a low-temperature pipe disposed horizontally adjacent to said high-temperature pipe and through which a low-temperature fluid having a temperature lower than that of the high-temperature fluid passes;
   a thermoelectric module interposed between said high-temperature pipe and said low-temperature pipe for generating electrical power using a temperature difference between said high-temperature pipe and said low-temperature pipe;
   a fluid chamber connected to an upper portion and a lower portion of said low-temperature pipe, parallel to said low-temperature pipe; and
   a fluid replenisher capable of replenishing said fluid chamber with the low-temperature fluid in a liquid state.

2. The thermoelectric generation apparatus according to claim 1, wherein
   said fluid chamber comprises a level sensor capable of detecting a liquid level of the low-temperature fluid inside said low-temperature pipe.

3. The thermoelectric generation apparatus according to claim 1, further comprising
   a vessel containing said high-temperature pipe, said low-temperature pipe and said thermoelectric module and the internal pressure of which can be reduced, wherein
   said fluid chamber is provided outside said vessel.

4. The thermoelectric generation apparatus according to claim 1, wherein
   said fluid replenisher is configured by a tank for storing the low-temperature fluid for reserve.

5. The thermoelectric generation apparatus according to claim 4, further comprising
   fail-safe valves respectively provided on a supply side and a discharge side of said low-temperature pipe and configured to block the supply side of said low-temperature pipe while opening the discharge side of said low-temperature pipe, when the supply of the low-temperature fluid to said low-temperature pipe is stopped.

6. The thermoelectric generation apparatus according to claim 1, wherein
   said fluid replenisher is configured by a condenser interposed between the discharge side of said low-temperature pipe and a supply side of said fluid chamber and configured to condense the steam generated from the low-temperature fluid discharged from said low-temperature pipe.

7. The thermoelectric generation apparatus according to claim 6, further comprising
   fail-safe valves respectively provided on the supply side and the discharge side of said low-temperature pipe and configured to block both the supply side and the discharge side of said low-temperature pipe to form a closed loop between said low-temperature pipe and said fluid chamber, when the supply of the low-temperature fluid to said low-temperature pipe is stopped.

8. The thermoelectric generation apparatus according to claim 1, further comprising fail-safe valves respectively provided on a supply side and a discharge side of said high-temperature pipe and configured to block both the supply side and the discharge side of said high-temperature pipe, when the supply of the high-temperature fluid to said high-temperature pipe is stopped.

* * * * *